US012740135B2

(12) United States Patent
Bu et al.

(10) Patent No.: US 12,740,135 B2
(45) Date of Patent: Sep. 15, 2026

(54) THIN BIDIRECTIONAL BIPOLAR JUNCTION TRANSISTOR DEVICES FROM BONDED WIDE AND THICK WAFERS

(71) Applicant: IDEAL POWER INC., Austin, TX (US)

(72) Inventors: Jiankang Bu, Austin, TX (US); R. Daniel Brdar, Driftwood, TX (US); Ruiyang Yu, Austin, TX (US); Yifan Jiang, Austin, TX (US)

(73) Assignee: IDEAL POWER INC., Austin, TX (US)

( * ) Notice: Subject to any disclaimer, the term of this patent is extended or adjusted under 35 U.S.C. 154(b) by 430 days.

(21) Appl. No.: 18/512,271

(22) Filed: Nov. 17, 2023

(65) Prior Publication Data

US 2024/0194736 A1 Jun. 13, 2024

Related U.S. Application Data

(60) Provisional application No. 63/386,598, filed on Dec. 8, 2022.

(51) Int. Cl.
*H10D 84/60* (2025.01)
*H10D 62/832* (2025.01)
(Continued)

(52) U.S. Cl.
CPC ......... *H10D 84/60* (2025.01); *H10D 62/8325* (2025.01); *H10D 84/0112* (2025.01);
(Continued)

(58) Field of Classification Search
CPC ............... H10D 84/60; H10D 62/8325; H10D 84/0112; H10D 10/40; H10D 10/056;
(Continued)

(56) References Cited

U.S. PATENT DOCUMENTS 2,317,249 A 4/1943 Brickman
2,321,988 A 6/1943 Brickman
(Continued)

FOREIGN PATENT DOCUMENTS

CN 106049318 A 10/2016
DE 102021203861 A1 10/2022
(Continued)

OTHER PUBLICATIONS

International Search Report and Written Opinion mailed Jul. 18, 2024 for International Application No. PCT/US2024/020909, 13 pages.

(Continued)

*Primary Examiner* — Earl N Taylor
(74) *Attorney, Agent, or Firm* — Dickinson Wright PLLC

(57) ABSTRACT

Thin bidirectional bipolar junction transistor (BJT) devices and methods for fabricating thin bidirectional BJT devices. The method includes forming a first base region and a first emitter/collector region on a first side of a first thick semiconductor wafer. The method also includes removing a portion of the first thick semiconductor wafer to produce a first thin semiconductor wafer. The method further includes forming a second base region and a second emitter/collector region on a second side of the first thin semiconductor wafer opposite the first side. The method also includes producing a second thin semiconductor wafer. The method further includes bonding the first thin semiconductor wafer to the second thin semiconductor wafer.

20 Claims, 6 Drawing Sheets

(51) Int. Cl.
*H10D 84/01* (2026.01)
*H10P 32/00* (2026.01)
*H10P 52/00* (2026.01)
*H10W 80/00* (2026.01)

(52) U.S. Cl.
CPC .............. *H10P 32/00* (2026.01); *H10P 52/00* (2026.01); *H10W 80/312* (2026.01); *H10W 80/327* (2026.01)

(58) Field of Classification Search
CPC .. H10D 62/177; H10D 10/041; H10D 62/133; H10D 62/137; H10P 32/00; H10P 52/00; H10P 10/128; H10P 10/1285; H10W 80/312; H10W 80/327; H01L 21/187; H01L 21/22; H01L 21/304; H01L 29/732; H01L 29/66068; H01L 29/66295; H01L 29/1608; H01L 29/1004; H01L 29/0804; H01L 29/0821; H01L 29/66265
See application file for complete search history.

(56) References Cited

U.S. PATENT DOCUMENTS 3,210,051 A 10/1965 Case
3,567,184 A 3/1971 Yancey
5,039,066 A 8/1991 Stacey
6,065,738 A 5/2000 Pearce et al.
6,153,495 A 11/2000 Kub et al.
6,902,151 B1 6/2005 Nilsson
6,932,327 B2 8/2005 Alberson et al.
6,948,703 B2 9/2005 Alberson et al.
6,962,328 B2 11/2005 Bergendahl
7,220,661 B1 5/2007 Yu et al.
7,235,735 B2 6/2007 Venkatasubramanian et al.
7,364,137 B2 4/2008 Neusch
7,398,960 B2 7/2008 Neusch
8,089,129 B2 1/2012 Disney et al.
8,246,013 B2 8/2012 Mauer et al.
8,674,470 B1 3/2014 Or-Bach et al.
8,829,562 B2 9/2014 Schulze et al.
8,973,903 B2 3/2015 Akerstrom
8,992,116 B2 3/2015 Sloan et al.
9,029,909 B2 5/2015 Blanchard et al.
9,035,350 B2 5/2015 Blanchard et al.
9,059,710 B2 6/2015 Blanchard et al.
9,121,149 B2 9/2015 Sharp et al.
9,159,819 B2 10/2015 Pfirsch et al.
9,178,092 B2 11/2015 Bui et al.
9,190,894 B2 11/2015 Alexander et al.
9,355,353 B2 5/2016 Von Mueller et al.
9,444,449 B2 9/2016 Alexander et al.
9,742,385 B2 * 8/2017 Alexander ........... H10D 10/861
10,374,070 B2 8/2019 Wood
10,964,664 B2 3/2021 Mandalapu et al.
11,411,557 B2 * 8/2022 Mojab .................. H03K 17/668
11,496,129 B2 * 11/2022 Mojab ................. H02M 1/0006
11,538,762 B2 12/2022 Chun
11,773,548 B2 10/2023 Faulkenberry et al.
11,777,018 B2 * 10/2023 Blanchard ............ H10D 62/133 257/565
11,804,835 B2 * 10/2023 Mojab .................. H03K 17/668
11,881,525 B2 * 1/2024 Bu ......................... H10D 10/40
12,148,819 B2 * 11/2024 Bu ......................... H10D 10/40
2002/0004287 A1 * 1/2002 Ravi ....................... H10P 52/00 438/459
2002/0094607 A1 * 7/2002 Gebauer ............... H10W 90/00 257/E21.597
2002/0180013 A1 * 12/2002 Brofman ................. H10P 72/74 438/106
2004/0020513 A1 * 2/2004 Bergman ............ H10P 72/0424 134/2
2005/0280155 A1 12/2005 Lee
2006/0138643 A1 * 6/2006 Lu ....................... H10W 74/117 257/E23.092
2007/0037319 A1 * 2/2007 Chan ....................... H10P 72/74 257/E23.129
2008/0013351 A1 1/2008 Alexander
2008/0031019 A1 2/2008 Alexander
2008/0296546 A1 12/2008 Bergendahl
2009/0146121 A1 6/2009 Sharp et al.
2010/0067272 A1 3/2010 Alexander
2010/0090185 A1 4/2010 Mauer et al.
2011/0292697 A1 12/2011 Alexander
2012/0008353 A1 1/2012 Alexander
2012/0014151 A1 1/2012 Alexander
2012/0020129 A1 1/2012 Alexander
2012/0033464 A1 2/2012 Alexander
2012/0051100 A1 3/2012 Alexander
2012/0268975 A1 10/2012 Alexander
2012/0274138 A1 11/2012 Bundschuh et al.
2012/0279567 A1 11/2012 Alexander
2013/0038129 A1 2/2013 Bundschuh et al.
2013/0063988 A1 3/2013 Alexander
2013/0063994 A1 3/2013 Alexander
2013/0069605 A1 3/2013 Alexander
2013/0114303 A1 5/2013 Bundschuh et al.
2013/0114311 A1 5/2013 Alexander
2013/0114315 A1 5/2013 Alexander
2013/0114316 A1 5/2013 Alexander
2013/0307336 A1 11/2013 Bundschuh et al.
2013/0314096 A1 11/2013 Bundschuh et al.
2013/0342262 A1 12/2013 Konstantinov
2014/0029320 A1 1/2014 Alexander
2014/0036554 A1 2/2014 Alexander
2014/0133203 A1 5/2014 Alexander
2014/0319911 A1 10/2014 Alexander
2014/0368038 A1 12/2014 Alexander
2014/0375287 A1 * 12/2014 Blanchard ........... H02M 3/1582 323/271
2014/0376291 A1 12/2014 Blanchard et al.
2015/0003115 A1 1/2015 Barron et al.
2015/0029769 A1 1/2015 Blanchard et al.
2015/0054552 A1 2/2015 Blanchard et al.
2015/0061569 A1 3/2015 Alexander et al.
2015/0061732 A1 3/2015 Blanchard et al.
2015/0214055 A1 * 7/2015 Blanchard ............ H10D 10/861 438/548
2015/0214299 A1 7/2015 Blanchard
2015/0214782 A1 7/2015 Alexander
2015/0214784 A1 7/2015 Alexander
2015/0222146 A1 8/2015 Alexander
2015/0222147 A1 8/2015 Alexander
2015/0222194 A1 8/2015 Bundschuh
2015/0270771 A1 9/2015 Alexander et al.
2015/0270837 A1 9/2015 Alexander et al.
2015/0280613 A1 10/2015 Alexander et al.
2015/0288358 A1 10/2015 Alexander et al.
2015/0303915 A1 10/2015 Alexander et al.
2015/0311777 A1 10/2015 Alexander et al.
2015/0318704 A1 11/2015 Barron et al.
2016/0006430 A1 1/2016 Alexander et al.
2016/0072400 A1 3/2016 Alexander
2016/0241232 A1 * 8/2016 Alexander ........... H10D 62/115
2016/0322350 A1 11/2016 Blanchard
2016/0322484 A1 11/2016 Blanchard
2016/0329324 A1 * 11/2016 Blanchard ............ H10D 62/177
2016/0329418 A1 * 11/2016 Blanchard ............ H10D 62/126
2016/0344300 A1 11/2016 Alexander
2016/0351399 A1 * 12/2016 Blanchard ............ H10D 10/861
2017/0047922 A1 * 2/2017 Alexander ............... H10D 8/60
2017/0085179 A1 3/2017 Alexander et al.
2017/0104478 A1 * 4/2017 Alexander ........... H10D 12/411
2017/0126225 A1 5/2017 Alexander et al.
2017/0271328 A1 9/2017 Alexander
2017/0287721 A1 10/2017 Wood
2017/0288561 A1 10/2017 Lemberg et al.
2017/0317575 A1 11/2017 Alexander
2017/0345917 A1 11/2017 Basler et al.
2018/0026122 A1 1/2018 Blanchard et al.
2018/0109101 A1 4/2018 Alexander
2018/0130898 A1 5/2018 Blanchard et al.
2018/0219061 A1 8/2018 Alexander et al.
2018/0226254 A1 8/2018 Blanchard et al.

(56) References Cited

U.S. PATENT DOCUMENTS

| | | | |
|---|---|---|---|
| 2019/0032292 A1 | 1/2019 | Allington et al. | |
| 2019/0088645 A1 | 3/2019 | Alexander | |
| 2019/0097031 A1 | 3/2019 | Alexander et al. | |
| 2019/0140548 A1 | 5/2019 | Alexander | |
| 2019/0267810 A1 | 8/2019 | Johns | |
| 2019/0363196 A1 | 11/2019 | Wood | |
| 2020/0006945 A1 | 1/2020 | Lemberg et al. | |
| 2020/0058780 A1* | 2/2020 | Alexander | H10D 18/80 |
| 2020/0111672 A1* | 4/2020 | Blanchard | H10P 32/14 |
| 2020/0243674 A1 | 7/2020 | Alexander et al. | |
| 2021/0313461 A1 | 10/2021 | Blanchard et al. | |
| 2021/0359678 A1* | 11/2021 | Mojab | H03K 17/668 |
| 2021/0384900 A1* | 12/2021 | Mojab | H02M 1/0006 |
| 2021/0398977 A1 | 12/2021 | Mishra et al. | |
| 2022/0077852 A1* | 3/2022 | Mojab | H03K 17/668 |
| 2022/0157974 A1* | 5/2022 | Blanchard | H10D 62/177 |
| 2022/0190115 A1 | 6/2022 | Mojab et al. | |
| 2023/0048984 A1 | 2/2023 | Bu et al. | |
| 2023/0066664 A1 | 3/2023 | Mojab et al. | |
| 2023/0299188 A1 | 9/2023 | Blanchard et al. | |
| 2023/0386987 A1 | 11/2023 | Bu et al. | |
| 2024/0113210 A1* | 4/2024 | Bu | H10D 10/40 |

FOREIGN PATENT DOCUMENTS

| | | | |
|---|---|---|---|
| EP | 3185421 | B1 | 12/2020 |
| EP | 3913806 | A1 | 11/2021 |
| WO | 9946809 | A1 | 9/1999 |
| WO | 2003007354 | A1 | 1/2003 |
| WO | 2005040499 | A1 | 5/2005 |
| WO | 2007129914 | A1 | 11/2007 |
| WO | 2012037607 | A1 | 3/2012 |
| WO | 2014122472 | A1 | 8/2014 |
| WO | 2016000840 | A1 | 7/2016 |

OTHER PUBLICATIONS

Dong, Mouzhi, et al., "B-Tran™ Optimization and Performance Characterization", Applied Power Electronics Conference and Exposition (APEC), Mar. 19, 2023, 5 pages, doi: 10.1109/APEC43580.2023.10131453.

Mojab, Alireza, et al., "Operation and Characterization of Low-Loss Bidirectional Bipolar Junction TRANsistor (B-Tran™)", Applied Power Electronics Conference and Exposition (APEC), Mar. 2022, 5 pages, doi: 10.1109/APEC43599.2022.9773733.

International Search Report and Written Opinion mailed Mar. 20, 2024 for International Application No. PCT/US2023/080216, 16 pages.

Wang, Zheng, et al., "A Reliable Double-Sided 1200-V/600-A Multichip Half-bridge Insulated Gate Bipolar Transistor (IGBT) Module with High Power Density", 2018 1st Workshop on Wide Bandgap Power Devices and Applications in Asia (WiPDA Asia), May 2018, 6 pages.

Lai, Ruby A., et al., "Double-Sided Transistor Device Processability of Carrierless Ultrathin Silicon Wafers", Wiley, DOI: 10.1002/inf2.12087, Dec. 2019, 8 pages.

Corradino, Thomas, et al., "Design and Characterization of Backside Termination Structures for Thick Fully-Depleted MAPS", Sensors, doi.org/10.3390/s21113809, May 2021, 17 pages.

European Patent Office, Search Report and Written Opinion for International Application No. PCT/2025/024649, Date of Mailing Jul. 25, 2025, 11 pages.

European Patent Office, Search Report and Written Opinion for International Application No. PCT/2025/026149, Date of Mailing Jul. 17, 2025, 13 pages.

* cited by examiner

THIN BIDIRECTIONAL BIPOLAR JUNCTION TRANSISTOR DEVICES FROM BONDED WIDE AND THICK WAFERS

CROSS-REFERENCE TO RELATED APPLICATIONS

This application claims the benefit of U.S. Provisional Application No. 63/386,598 filed Dec. 8, 2022 titled "SEMICONDUCTOR DEVICES AND METHODS OF FABRICATING SAME." The provisional application is incorporated by reference herein as if reproduced in full below.

BACKGROUND

A bidirectional bipolar junction transistor (or "BJT") is a junction transistor constructed with a base and collector-emitters on one side of a semiconductor wafer and distinct, separate base and collector-emitters on the opposite side of the semiconductor wafer. When properly configured by an external driver, electrical current may selectively flow through a bidirectional BJT in either direction. Whether a collector-emitter is considered a collector (for example, current flow into the bidirectional bipolar junction transistor) or an emitter (for example, current flow out of the bidirectional bipolar junction transistor) depends on the applied external voltage, and thus the direction of current flow through the bidirectional BJT.

SUMMARY

A collector-emitter voltage drop (or "$V_{CEon}$") occurs while current is flowing between the collector-emitters in a bidirectional BJT with a double-sided double-base. This voltage drop results in a power loss. Reducing this voltage drop will decrease the power loss and increase efficiency. For example, a lower voltage drop can be achieved by positioning the collector-emitters closer to each other within the semiconductor wafer. However, fabricating bidirectional BJT devices with thin semiconductor wafers may complicate large volume production. Thus, the present disclosure provides thin bidirectional BJT devices and methods for fabricating thin bidirectional BJT devices that include, among other things, thick semiconductor wafers that are processed, grinded into thin semiconductor wafers, and then bonded using thin wafer bonding processes.

The present disclosure provides a method for fabricating a thin bidirectional bipolar junction transistor device. The method includes forming a first base region and a first emitter/collector region on a first side of a first thick semiconductor wafer. The method also includes removing a portion of the first thick semiconductor wafer to produce a first thin semiconductor wafer. The method further includes forming a second base region and a second emitter/collector region on a second side of the first thin semiconductor wafer opposite the first side. The method also includes producing a second thin semiconductor wafer. The method further includes bonding the first thin semiconductor wafer to the second thin semiconductor wafer.

The present disclosure also provides a method for fabricating a thin bidirectional bipolar junction transistor device. The method includes activating, with a diffusion process, a first-conductivity-type dopant and a second conductivity-type dopant introduced into different regions on a first side of a first semiconductor wafer. The method also includes reducing a thickness of the first semiconductor wafer by removing a portion of the first semiconductor wafer from a second side of the first semiconductor wafer opposite the first side of the first semiconductor wafer. The method further includes activating, without the diffusion process, the first-conductivity-type dopant and the second conductivity-type dopant introduced into different regions on the second side of the first semiconductor wafer. The method also includes activating, with the diffusion process, the first-conductivity-type dopant and the second conductivity-type dopant introduced into different regions on a first side of a second semiconductor wafer. The method further includes reducing a thickness of the second semiconductor wafer by removing a portion of the second semiconductor wafer from a second side of the second semiconductor wafer opposite the first side of the second semiconductor wafer. The method also includes activating, without the diffusion process, the first-conductivity-type dopant and the second conductivity-type dopant introduced into different regions on the second side of the second semiconductor wafer. The method further includes bonding the first semiconductor wafer to the second semiconductor wafer.

The present disclosure further provides a thin bidirectional bipolar junction transistor device including, in one implementation, a first semiconductor wafer and a second semiconductor wafer. The first semiconductor wafer includes a first front side junction with a first base region and a first emitter/collector region on a first side of the first semiconductor wafer. The first semiconductor wafer also includes a first backside junction with a second base region and a second emitter/collector region on a second side of the first semiconductor wafer opposite the first side of the first semiconductor wafer. The first backside junction is thinner than the first front side junction. The second semiconductor wafer includes a second front side junction with a third base region and a third emitter/collector region on a first side of the second semiconductor wafer. The second semiconductor wafer also includes a second backside junction with a fourth base region and a fourth emitter/collector region on a second side of the second semiconductor wafer opposite the first side of the second semiconductor wafer. The second backside junction is thinner than the second front side junction. The second side on the first semiconductor wafer is bonded to the second side of the second semiconductor wafer.

BRIEF DESCRIPTION OF THE DRAWINGS

For a detailed description of example embodiments, reference will now be made to the accompanying drawings in which.

DEFINITIONS

Figure 1:
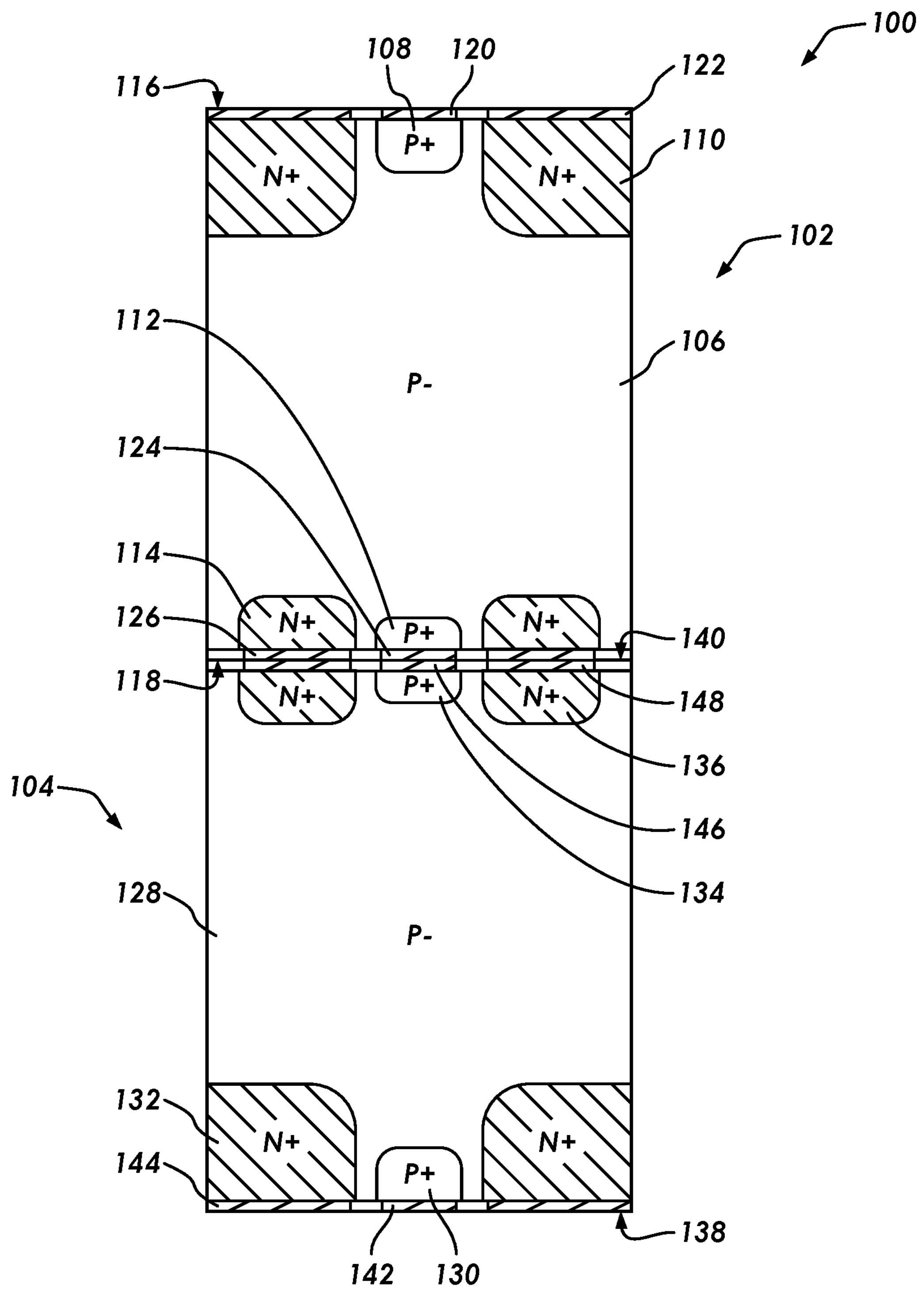
FIG. 1 is a schematic cross-sectional view of an example of a thin bidirectional BJT device in accordance with some implementations.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Collector-emitter" of a bipolar junction transistor shall mean a region of the bipolar junction transistor through which main load current flows. For purposes of this specification and claims, the designation as a collector-emitter is independent of the underlying device physics within the bipolar junction transistor. For example, for a double-sided, double-base PNP transistor, the main load current may flow from an upper P-type region, through the bulk N-type region, and then out the lower P-type region, and when so used the upper P-type region and the lower P-type region are considered collector-emitters. However, in other cases, such as described in co-pending and commonly assigned U.S. Provisional Application No. 63/382,924 filed Nov. 9, 2022 and titled "Methods and Systems of Operating a PNP Bi-Directional Double-Base Bipolar Junction Transistor," the main load current may flow from an upper N-type region, through the bulk N-type region, and then through the lower N-type region, and when so used the upper and lower N-type regions are considered collector-emitters.

"Base" of a bipolar junction transistor shall mean a region of the bipolar junction transistor through which control current flows, the control current distinct from the main load current. For purposes of this specification and claims, the designation as a base is independent of the underlying device physics within the bipolar junction transistor. For example, for a double-sided, double-base PNP transistor, the control current may flow into an upper N-type region or a lower N-type region, and when so used the upper N-type region and the lower N-type region are considered bases. However, in other cases, such as described in co-pending and commonly assigned U.S. Provisional Application No. 63/382,924 noted above, the control current may flow into an upper P-type region or a lower P-type region, and when so used the upper and lower P-type regions are considered bases.

In relation to electrical devices (whether stand alone or as part of an integrated circuit), the terms "input" and "output" refer to electrical connections to the electrical devices, and shall not be read as verbs requiring action. For example, a differential amplifier, such as an operational amplifier, may have a first differential input and a second differential input, and these "inputs" define electrical connections to the operational amplifier, and shall not be read to require inputting signals to the operational amplifier.

DETAILED DESCRIPTION

The following discussion is directed to various implementations of the invention. Although one or more of these implementations may be preferred, the implementations disclosed should not be interpreted, or otherwise used, as limiting the scope of the present disclosure, including the claims. In addition, one skilled in the art will understand that the following description has broad application, and the discussion of any implementation is meant only to be exemplary of that implementation, and not intended to intimate that the scope of the present disclosure, including the claims, is limited to that implementation.

Various examples are directed to thin bidirectional bipolar junction transistors (or "BJT") devices and methods of fabricating thin bidirectional BJT devices. More particularly, various examples are directed to thin bidirectional BJT devices fabricated from thick, wide-diameter wafers. More particularly still, various examples are directed to thin bidirectional BJT devices fabricated using thin wafer bonding processes. The specification first turns to an example completed thin bidirectional BJT device to orient the reader.

FIG. 1 is a schematic cross-sectional view of an example of a thin bidirectional BJT device 100 in accordance with some implementations of the present disclosure. The thin bidirectional BJT device 100 illustrated in FIG. 1 includes an upper thin semiconductor wafer 102 and a lower thin semiconductor wafer 104. The designations "upper" and "lower" are arbitrary and shall not be read to require any particular physical layout.

The upper thin semiconductor wafer 102 illustrated in FIG. 1 includes a drift region 106, an outer base region 108, an outer emitter/collector region 110, an inner base region 112, and an inner emitter/collector region 114. The outer base region 108 and the outer emitter/collector region 110 are formed on a front side 116 of the upper thin semiconductor wafer 102, as illustrated in FIG. 1. The inner base region 112 and the inner emitter/collector region 114 are formed on a backside 118 of the upper thin semiconductor wafer 102, as illustrated in FIG. 1. The upper thin semiconductor wafer 102 illustrated in FIG. 1 also includes metal pads 120, 122, 124, and 126. The metal pad 120 is coupled to the outer base region 108. The metal pad 122 is coupled to the outer emitter/collector region 110. The metal pad 124 is coupled to the inner base region 112. The metal pad 126 is coupled to the inner emitter/collector emitter 114.

The lower thin semiconductor wafer 104 illustrated in FIG. 1 includes a drift region 128, an outside base region 130, an outside emitter/collector region 132, an inside base region 134, and an inside emitter/collector region 136. With respect to the regions in the lower thin semiconductor wafer 104, this specification uses "inside" and "outside" terminology as a naming convention to reduce confusion with similarly situated regions in the upper thin semiconductor wafer 102. The outside base region 130 and the outside emitter/collector region 132 are formed on a front side 138 of the lower thin semiconductor wafer 104, as illustrated in FIG. 1. The inside base region 134 and the inside emitter/collector region 136 are formed on a backside 140 of the lower thin semiconductor wafer 104, as illustrated in FIG. 1. The lower thin semiconductor 104 illustrated in FIG. 1 also includes metal pads 142, 144, 146, and 148. The metal pad 142 is coupled to the outside base region 130. The metal pad 144 is coupled to the outside emitter/collector region 132.

The metal pad 146 is coupled to the inside base region 134. The metal pad 148 is coupled to the inside emitter/collector region 136.

In some implementations, the drift regions 106 and 128 include a semiconductor material such as silicon carbide (or "SiC") or gallium nitride (or "GaN"). For SiC, there is a limitation on how thick the drift region can be. In particular, unlike silicon, a chemical vapor deposition (or "CVD") method may be used to form a low doped drift region. The CVD methods may be time consuming, and increasing the epitaxy layer thickness while maintaining sufficient quality may be technically challenging. Furthermore, costs rise rapidly with the thicker epitaxy layer. However, by bonding two thin semiconductor wafers as described herein, a thin bidirectional BJT device formed with SiC may have a drift region with higher quality and lower cost than SiC devices produced using other methods. In some implementations, the drift regions 106 and 128 may be a P-type semiconductor, as illustrated in FIG. 1. In alternate implementations, the drift regions 106 and 128 may be an N-type semiconductor.

The backside 118 of the upper thin semiconductor wafer 102 is bonded to the backside 140 of the lower thin semiconductor wafer 104. For example, as illustrated in FIG. 1, the metal pad 124 may be electrically coupled to the metal pad 146, and the metal pad 126 may be electrically coupled to the metal pad 148.

As described above, a lower collector-emitter voltage drop (or "$V_{CEon}$") can be achieved in bidirectional BJT device by positioning the collector-emitters closer to each other within the semiconductor wafer. One approach to doing so is to reduce the thickness of the semiconductor wafer on the surfaces upon which the collector-emitters are fabricated. This approach is viable for semiconductor wafers of smaller diameters, such as 4-inch and 6-inch wafers. However, as wafer diameter increases so does the risk of wafer breakage during fabrication. For example, semiconductor wafers having 8-inch or 12-inch diameters but that are too thin can suffer significantly increased breakage rates. Due to the risks of breakage, certain foundries require minimum wafer thicknesses, such as at least a 500 micrometers thickness for a 6-inch wafer, and at least a 750 micrometer thickness for an 8-inch wafer.

Figure 2:
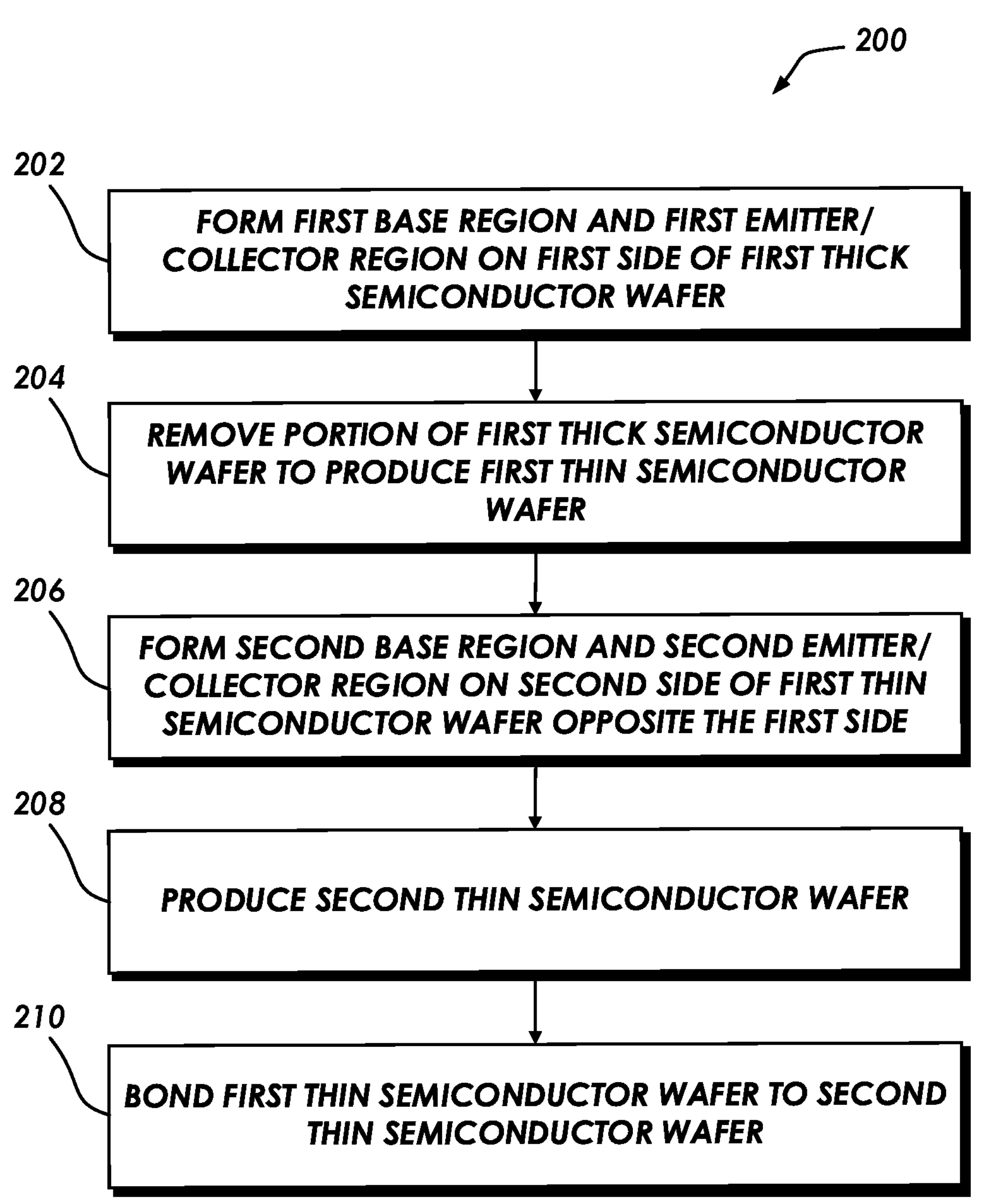
FIG. 2 is a flow diagram of an example of a method for fabricating a thin bidirectional BJT device from thick semiconductor wafers in accordance with some implementations.

While a larger semiconductor wafer diameter allows lowering per bidirectional BJT device cost and increasing the rate of production, the increased required thickness can increase $V_{CEon}$. However, a smaller thickness (and thus lower $V_{CEon}$) can be achieved by grinding two thick semiconductor wafers into two thin semiconductor wafers, and then bonding the two thin semiconductor wafers together. FIG. 2 is a flow diagram of an example of a method 200 for fabricating a thin bidirectional BJT device from thick semiconductor wafers in accordance with some implementations. For simplicity of explanation, the method 200 is described as a series of operations. However, operations in accordance with the present disclosure can occur in various orders and/or concurrently, and/or with other operations not presented and described herein. For example, the operations depicted in the method 200 in FIG. 2 may occur in combination with any other operation of any other method disclosed herein. Furthermore, not all illustrated operations may be required to implement the method 200 in accordance with the disclosed subject matter. In addition, those skilled in the art will understand and appreciate that the method 200 could alternatively be represented as a series of interrelated states via a state diagram or event diagram.

Figure 3:
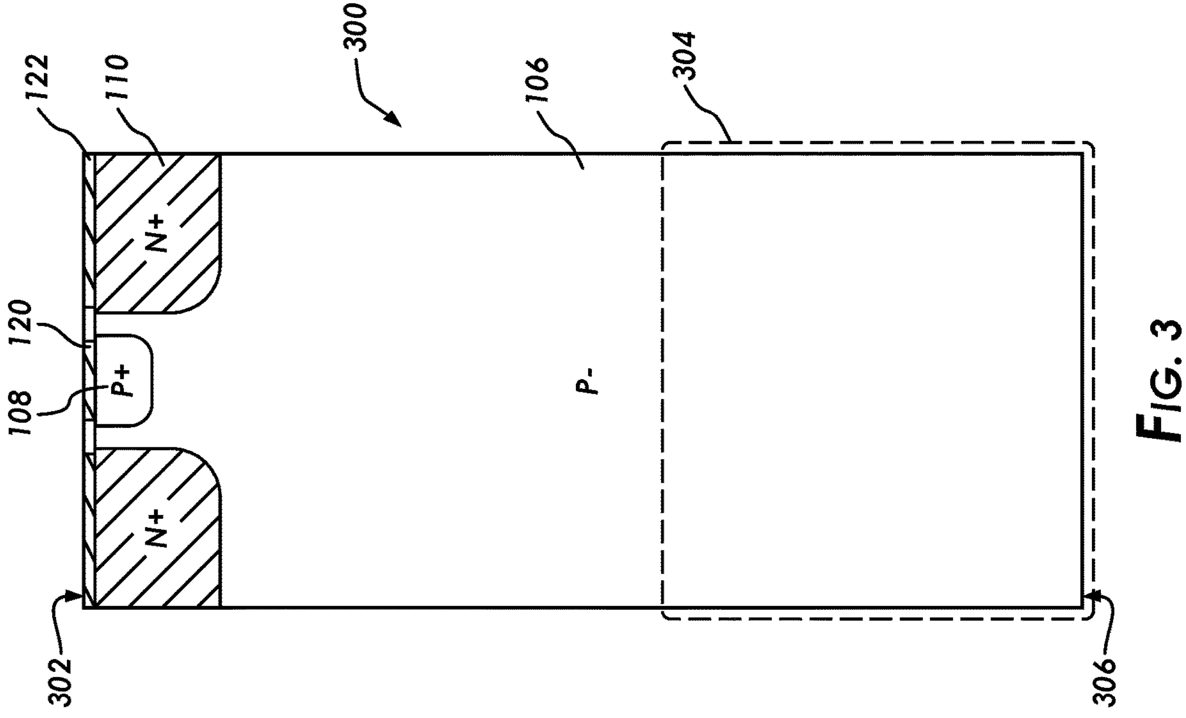
FIG. 3 is a schematic cross-sectional view of a thick semiconductor wafer with a front side P-N junction in accordance with some implementations.

At block 202, a first base region and a first emitter/collector region are formed on a first side of a first thick semiconductor wafer. In some implementations, the thickness of the first thick semiconductor wafer is about 750 micrometers and the diameter of the first thick semiconductor wafer is about 8 inches. In other implementations, the thickness of the first thick semiconductor wafer is about 1,000 micrometers and the diameter of the first thick semiconductor wafer is about 12 inches. FIG. 3 is a schematic cross-sectional view of an example of a thick semiconductor wafer 300 with the outer base region 108 and the outer emitter/collector region 110 formed on a front side 302 of the thick semiconductor wafer 300. The outer base region 108 and the outer emitter/collector region 110 are made from opposite-conductivity-type dopants to form a P-N junction on the front side 302 of the thick semiconductor wafer 300. For example, as illustrated in FIG. 3, a P-type dopant is introduced on a portion of the front side 302 of the thick semiconductor wafer 300 to form the outer base region 108. Also, as illustrated in FIG. 3, an N-type dopant is introduced on a different portion of the front side 302 of the thick semiconductor wafer 300 to form the outer emitter/collector region 110. In some implementations, the outer base region 108 may be formed using an N-type dopant and the outer emitter/collector region 110 may be formed using a P-type dopant. The P-type and N-type dopants of the outer base region 108 and the outer emitter/collector region 110 are activated with a diffusion process. For example, the P-type and N-type dopants of the outer base region 108 and the outer emitter/collector region 110 may be activated with a furnace process.

In some implementations, the outer base region 108 and the outer emitter/collector region 110 are metalized after their formation. For example, as illustrated in FIG. 3, the metal pad 120 may be formed on top of the outer base region 108 and the metal pad 122 may be formed on top of the outer emitter/collector region 110.

Figure 4:
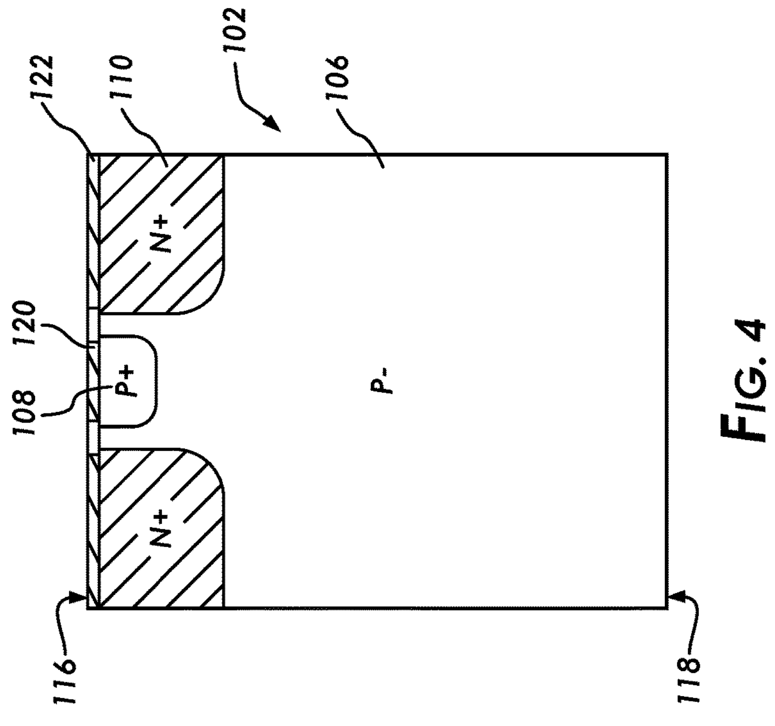
FIG. 4 is a schematic cross-sectional view of a thin semiconductor wafer with a front side P-N junction in accordance with some implementations.

Returning to FIG. 2, at block 204, a portion of the first thick semiconductor wafer is removed to produce a first thin semiconductor wafer. For example, a portion of the thick semiconductor wafer 300 (indicated in FIG. 3 by a dashed box 304) may be removed from a backside 306 of the thick semiconductor wafer 300 to produce the upper thin semiconductor wafer 102 as illustrated in FIG. 4. In some implementations, the backside 306 of the thick semiconductor wafer 300 may be grinded (using, for example, a Taiko process) to produce the upper thin semiconductor wafer 102. In some implementations, the thickness of the upper thin semiconductor wafer 102 may be in the range of about 80 micrometers to about 110 micrometers.

Figure 5:
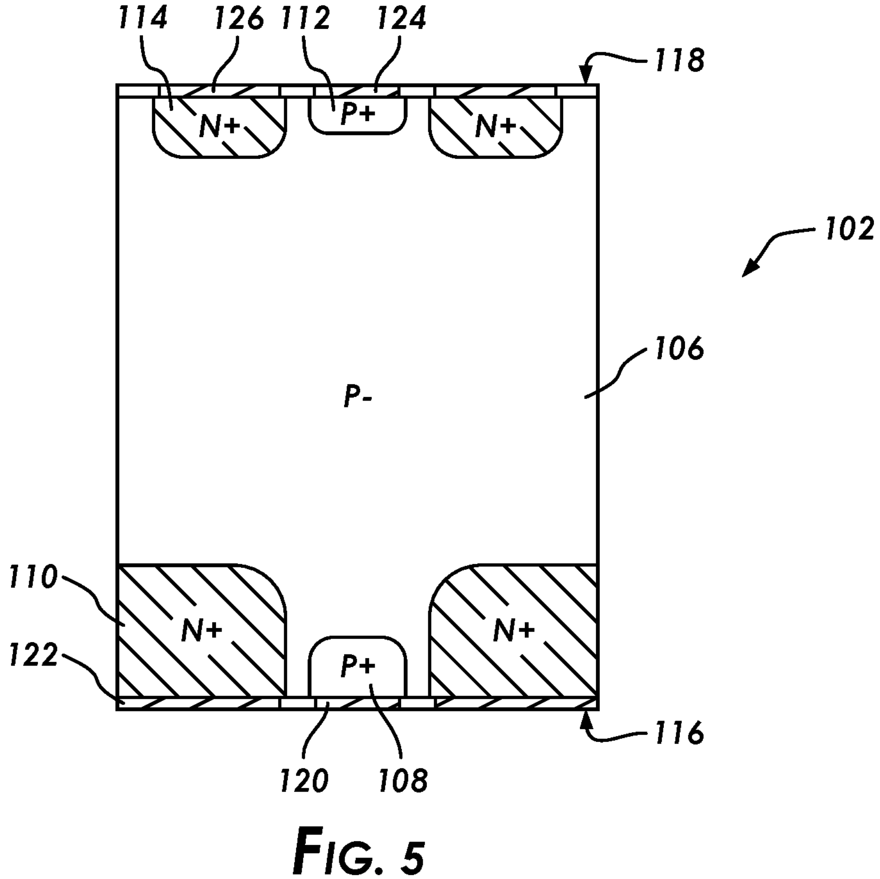
FIG. 5 is a schematic cross-sectional view of a thin semiconductor wafer with a front side P-N junction and a backside P-N junction in accordance with some implementations.

Returning to FIG. 2, at block 206, a second base region and a second emitter/collector region are formed on a second side of the first thin semiconductor wafer opposite the first side. For example, FIG. 5 is a schematic cross-sectional view of the upper thin semiconductor wafer 102 with the inner base region 112 and the inner emitter/collector region 114 formed on the backside 118 of the upper thin semiconductor wafer 102. Note that the upper thin semiconductor wafer 102 illustrated in FIG. 5 is flipped vertically relative to the upper thin semiconductor wafer 102 illustrated in FIG. 4. The inner base region 112 and the inner emitter/collector region 114 are made from opposite-conductivity-type dopants to form a P-N junction on the backside 118 of the upper thin semiconductor wafer 102. For example, as illustrated in FIG. 5, a P-type dopant may be introduced on a portion of the backside 118 of the upper thin semiconductor wafer 102 to form the inner base region 112. Also, as illustrated in FIG. 5, an N-type dopant may be introduced on a different portion of the backside 118 of the upper thin semiconductor wafer 102 to form the inner emitter/collector region 114. In some implementations, the inner base region 112 may be formed using an N-type dopant and the inner emitter/collector region 114 may be formed using a P-type dopant. In some implementations, a photolithograph may be used to form a P and N photo pattern before the P-type and N-type dopants are implanted (for example, similar to processes used to fabricate reverse-conducting insulated gate bipolar transistors).

Because the upper thin semiconductor wafer 102 is a thin wafer, the P-type and N-type dopants of the inner base region 112 and the inner emitter/collector region 114 may not be activated with a diffusion process. Rather, in some implementations, the P-type and N-type dopants of the inner base region 112 and the inner emitter/collector region 114 may be activated with a laser anneal process or a hot plasma process.

In some implementations, the inner base region 112 and the inner emitter/collector region 114 are metalized after their formation. For example, as illustrated in FIG. 5, the metal pad 124 may be formed on top of the inner base region 112 and the metal pad 126 may be formed on top of the inner emitter/collector region 114.

As illustrated in FIG. 5, the P-N junction on the backside 118 of the upper thin semiconductor wafer 102 is thinner than the P-N junction on the front side 116 of the upper thin semiconductor wafer 102. For example, the P-N junction on the backside 118 may be about 3 micrometers thick and the P-N junction on the front side 116 may be about 10 micrometers thick. In this manner, the breakdown voltage of the upper thin semiconductor wafer 102 is configured to be about half the target breakdown voltage of the thin bidirectional BJT device 100. For example, the breakdown voltage of the upper thin semiconductor wafer 102 may be about 600 Volts when the target breakdown voltage of the thin bidirectional BJT device 100 is about 1,200 Volts.

Returning to FIG. 2, at block 208, a second thin semiconductor wafer is produced. In some implementations, the second thin semiconductor wafer may be produced similar to first thin semiconductor wafer as described above in relation to blocks 202, 204, and 206. For example, the second thin semiconductor wafer may have a structure similar to the lower thin semiconductor wafer 104 described above in relation to FIG. 1.

At block 210, the first thin semiconductor wafer is bonded to the second thin semiconductor wafer. For example, the backside 118 of the upper thin semiconductor wafer 102 may be coupled to the backside 140 of the lower thin semiconductor wafer 104 as illustrated in FIG. 1. In some implementations, the metal pads of the P-N junction on the backside 118 of the upper thin semiconductor wafer 102 are electrically coupled to the metal pads of the P-N junction on the backside 140 of the lower thin semiconductor wafer 104. For example, as illustrated in FIG. 1, the metal pad 124 of the inner base region 112 of the upper thin semiconductor wafer 102 is electrically coupled to the metal pad 146 of the inside base region 134 of the lower thin semiconductor wafer 104, and the metal pad 126 of the inner emitter/collector region 114 of the upper thin semiconductor wafer 102 is electrically coupled to the metal pad 148 of the inside emitter/collector region 136 of the lower thin semiconductor wafer 104.

The bonded metal pads themselves may increase the inductance of the thin bidirectional BJT device 100 over other semiconductor devices without such bonded metal pads. However, the additional inductance is small. For example, at 1 megahertz, 1 centimeter of 1 millimeter copper wire may have an inductance of about 6 nanohenries and at 10 centimeters about 105 nanohenries, each of which is more than that incorporated into the thin bidirectional BJT devices disclosed herein. Further, a 4 micrometer thick, 500 micrometer diameter aluminum-copper alloy metal pad may have an inductance of about 0.005 nanohenries. Additional mitigation of inductance may result from increasing the area of the metallization (i.e., the area of the metal pad) and reducing its thickness. For example, an aluminum-copper alloy metal pad that is 2 micrometers thick and 1,000 micrometers wide may have a smaller inductance.

Figure 6:
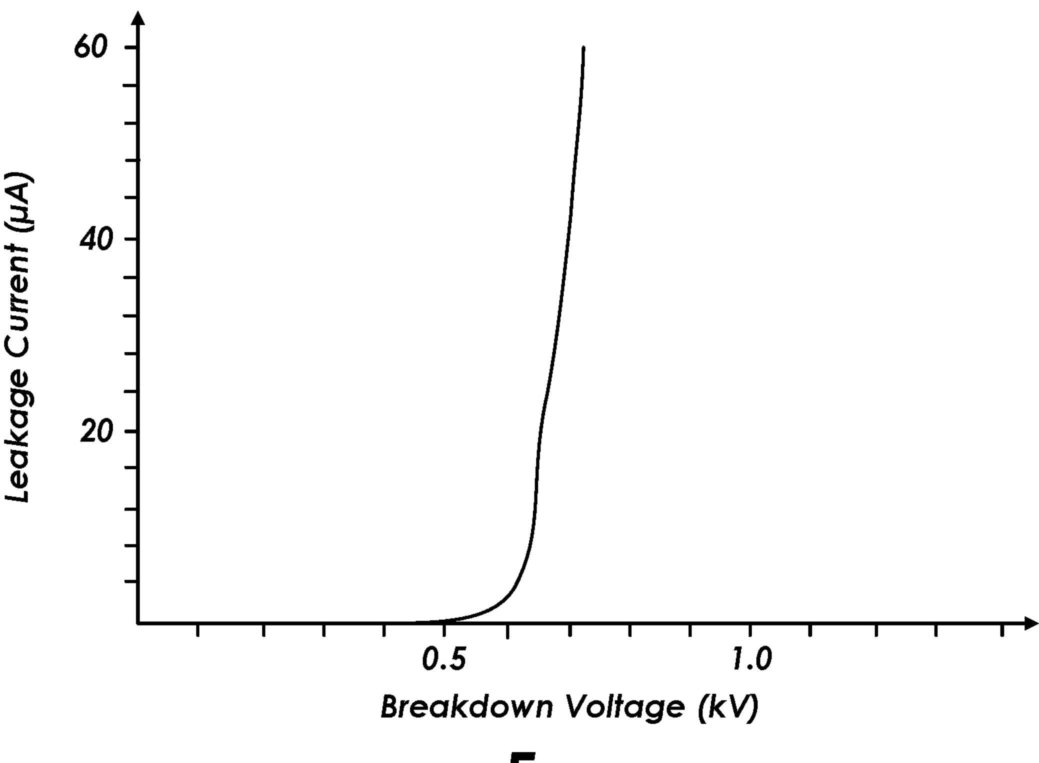
FIG. 6 shows a plot of an example of leakage current against breakdown voltage for a thin semiconductor wafer in accordance with some implementations.

FIG. 6 show a plot of an example of leakage current against breakdown voltage for a thin semiconductor wafer that is about 90 micrometers thick. FIG. 6 illustrates that the breakdown voltage of the thin semiconductor wafer is greater than 0.6 kilovolts. The 0.6 kilovolt breakdown voltage may be achieved with preliminary wafer thickness as well as implant and activation process condition optimization.

Figure 7:
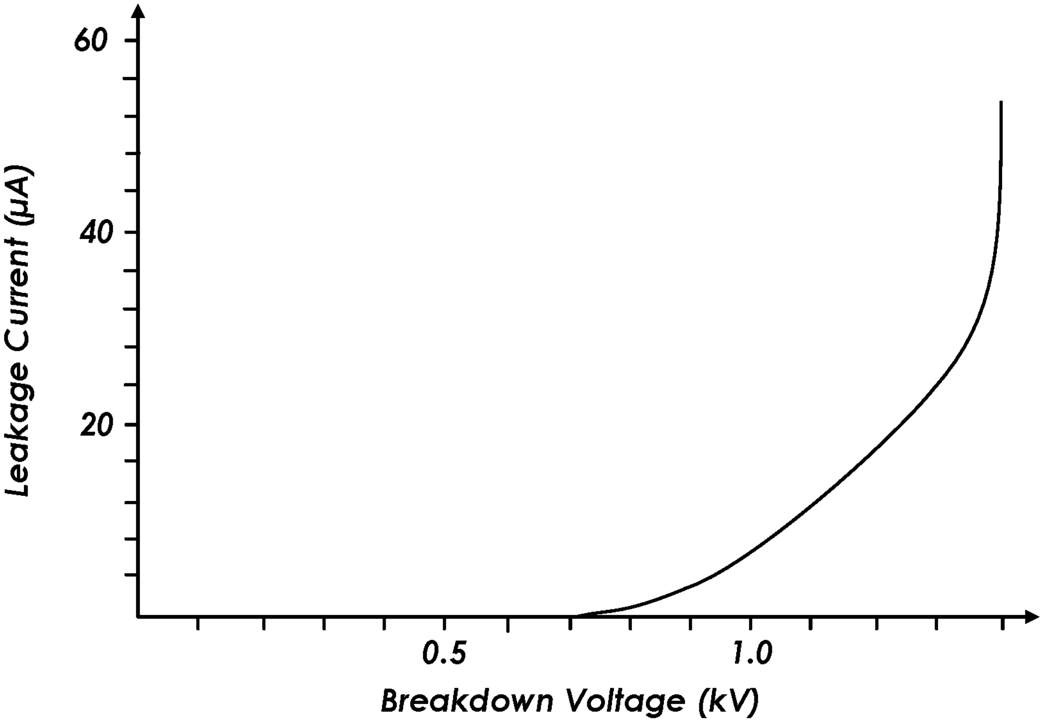
FIG. 7 shows a plot of an example of leakage current against breakdown voltage for a thin bidirectional BJT device in accordance with some implementations.

FIG. 7 shows a plot of an example of leakage current against breakdown voltage for a thin bidirectional BJT device that is about 180 micrometers thick. FIG. 7 illustrates that the breakdown voltage of the thin bidirectional BJT device is greater than 1.4 kilovolts.

Figure 8:
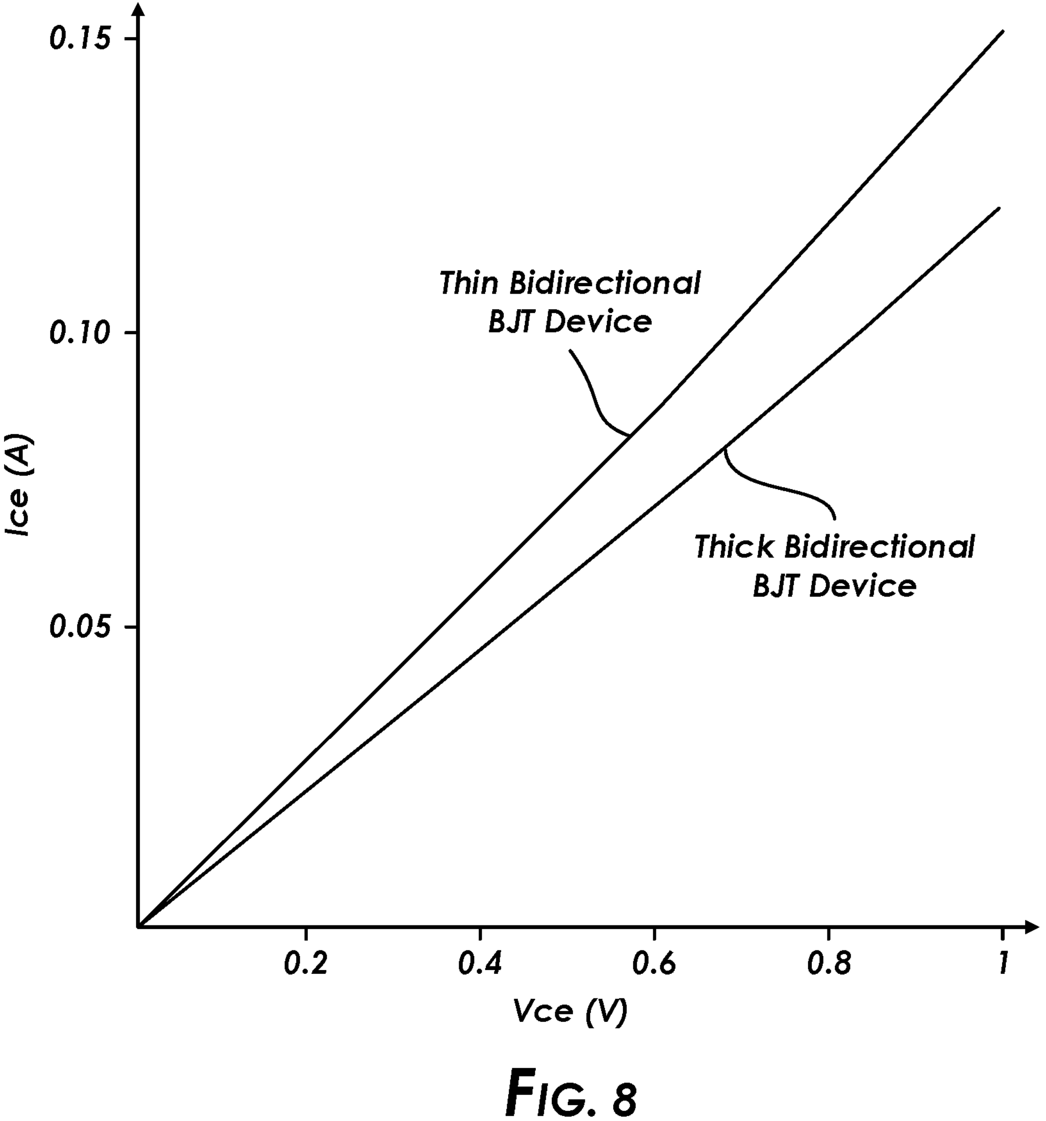
FIG. 8 shows plots of examples of collector-emitter current against collector-emitter voltage for a thick bidirectional BJT device and a thin bidirectional BJT device in accordance with some implementations.

FIG. 8 shows plots of examples of collector-emitter current (or "ICE") against collector-emitter voltage (or "VCE") for a 250-micrometer bidirectional BJT device fabricated using conventional techniques (an example of a thick bidirectional BJT device) and a thin bidirectional BJT device as disclosed herein. FIG. 8 illustrates that the collector-emitter voltage drop of the thin bidirectional BJT device is less than the collector-emitter voltage drop of the thick bidirectional BJT device (about 30% less). The lower collector-emitter voltage drop of the thin bidirectional BJT device is achieved while enabling such devices to be produced at higher volumes on larger semiconductor wafers.

The thin bidirectional BJT devices disclosed herein may be electrically coupled with an external driver (for example, driving circuitry) such as that disclosed in U.S. Pat. No. 11,411,557. Other driving circuitry may be used.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

CLAUSES

Clause 1. A method for fabricating a thin bidirectional bipolar junction transistor device, comprising:

- forming a first base region and a first emitter/collector region on a first side of a first thick semiconductor wafer;
- removing a portion of the first thick semiconductor wafer to produce a first thin semiconductor wafer;
- forming a second base region and a second emitter/collector region on a second side of the first thin semiconductor wafer opposite the first side;

producing a second thin semiconductor wafer; and bonding the first thin semiconductor wafer to the second thin semiconductor wafer.

Clause 2. The method of any clause herein, wherein producing the second thin semiconductor wafer further includes:

forming a third base region and a third emitter/collector region on a third side of a second thick semiconductor wafer, removing a portion of the second thick semiconductor wafer to produce the second thin semiconductor wafer, and forming a fourth base region and a fourth emitter/collector region on a fourth side of the second thin semiconductor wafer opposite the third side.

Clause 3. The method of any clause herein, wherein bonding the first thin semiconductor wafer to the second thin semiconductor wafer further includes:

electrically coupling a metal pad of the second base region to a metal pad of the fourth base region, and electrically coupling a metal pad of the second emitter/collector region to a metal pad of the fourth emitter/collector region.

Clause 4. The method of any clause herein, wherein removing the portion of the first thick semiconductor wafer further includes grinding the second side of the first thick semiconductor wafer.

Clause 5. The method of any clause herein, wherein forming the first base region and the first emitter/collector region on the first side of the first thick semiconductor wafer further includes activating, with a diffusion process, a first-conductivity-type dopant and a second conductivity-type dopant introduced into different regions on the first side of the first thick semiconductor wafer, and wherein forming the second base region and the second emitter/collector region on the second side of the first thin semiconductor wafer further includes activating, without the diffusion process, the first-conductivity-type dopant and the second conductivity-type dopant introduced into different regions on the second side of the first thin semiconductor wafer.

Clause 6. The method of any clause herein, wherein activating, without the diffusion process, the first-conductivity-type dopant and the second conductivity-type dopant introduced into the different regions on the second side of the first thin semiconductor wafer further includes activating, with a laser anneal process or a hot plasma process, the first-conductivity-type dopant and the second conductivity-type dopant introduced into the different regions on the second side of the first thin semiconductor wafer.

Clause 7. The method of any clause herein, wherein a thickness of the first thick semiconductor wafer is at least 750 micrometers, and wherein a thickness of the first thin semiconductor wafer is in a range of about 80 micrometers to about 110 micrometers.

Clause 8. A method for fabricating a thin bidirectional bipolar junction transistor device, comprising:

activating, with a diffusion process, a first-conductivity-type dopant and a second conductivity-type dopant introduced into different regions on a first side of a first semiconductor wafer;

reducing a thickness of the first semiconductor wafer by removing a portion of the first semiconductor wafer from a second side of the first semiconductor wafer opposite the first side of the first semiconductor wafer;

activating, without the diffusion process, the first-conductivity-type dopant and the second conductivity-type dopant introduced into different regions on the second side of the first semiconductor wafer;

activating, with the diffusion process, the first-conductivity-type dopant and the second conductivity-type dopant introduced into different regions on a first side of a second semiconductor wafer;

reducing a thickness of the second semiconductor wafer by removing a portion of the second semiconductor wafer from a second side of the second semiconductor wafer opposite the first side of the second semiconductor wafer;

activating, without the diffusion process, the first-conductivity-type dopant and the second conductivity-type dopant introduced into different regions on the second side of the second semiconductor wafer; and bonding the first semiconductor wafer to the second semiconductor wafer.

Clause 9. The method of any clause herein, wherein activating, without the diffusion process, the first-conductivity-type dopant and the second conductivity-type dopant introduced into the different regions on the second side of the first semiconductor wafer further includes activating, with a laser anneal process or a hot plasma process, the first-conductivity-type dopant and the second conductivity-type dopant introduced into the different regions on the second side of the first semiconductor wafer.

Clause 10. The method of any clause herein, wherein the diffusion process further includes a furnace process.

Clause 11. The method of any clause herein, wherein removing the portion of the first semiconductor wafer further includes grinding the second side of the first semiconductor wafer.

Clause 12. The method of claim 8, wherein bonding the first semiconductor wafer to the second semiconductor wafer further includes coupling the second side of the first semiconductor wafer to the second side of the second semiconductor wafer.

Clause 13. The method of any clause herein, wherein the thickness of the first semiconductor wafer is about 750 micrometers before removing the portion of the first semiconductor wafer, and wherein the thickness of the first semiconductor wafer is in a range of about 80 micrometers to about 110 micrometers after removing the portion of the first semiconductor wafer.

Clause 14. A thin bidirectional bipolar junction transistor device, comprising:

a first semiconductor wafer including:

a first front side junction including a first base region and a first emitter/collector region on a first side of the first semiconductor wafer, and a first backside junction including a second base region and a second emitter/collector region on a second side of the first semiconductor wafer opposite the first side of the first semiconductor wafer, wherein the first backside junction is thinner than the first front side junction; and a second semiconductor wafer including:

a second front side junction including a third base region and a third emitter/collector region on a first side of the second semiconductor wafer, and a second backside junction including a fourth base region and a fourth emitter/collector region on a second side of the second semiconductor wafer opposite the first side of the second semiconductor wafer, wherein the second backside junction is thinner than the second front side junction, wherein the second side on the first semiconductor wafer is bonded to the second side of the second semiconductor wafer.

Clause 15. The thin bidirectional bipolar junction transistor device of any clause herein, wherein a metal pad of the second base region is electrically coupled to a metal pad of the fourth base region, and wherein a metal pad of the second emitter/collector region is electrically coupled to a metal pad of the fourth emitter/collector region.

Clause 16. The thin bidirectional bipolar junction transistor device of any clause herein, wherein each of the first semiconductor wafer and the second semiconductor wafer has a thickness in a range of about 80 micrometers to about 110 micrometers.

Clause 17. The thin bidirectional bipolar junction transistor device of any clause herein, wherein each of the first semiconductor wafer and the second semiconductor wafer has a diameter of at least 8 inches.

Clause 18. The thin bidirectional bipolar junction transistor device of any clause herein, wherein a combined thickness of the first semiconductor wafer and the second semiconductor wafer is in a range of about 160 micrometers to about 220 micrometers.

Clause 19. The thin bidirectional bipolar junction transistor device of any clause herein, wherein each of the first semiconductor wafer and the second semiconductor wafer further includes silicon carbide.

Clause 20. The thin bidirectional bipolar junction transistor device of any clause herein, wherein each of the first semiconductor wafer and the second semiconductor wafer further includes gallium nitride.

What is claimed is:

1. A method for fabricating a thin bidirectional bipolar junction transistor device, comprising:

forming a first base region and a first emitter/collector region on a first side of a first thick semiconductor wafer;

removing a portion of the first thick semiconductor wafer to produce a first thin semiconductor wafer;

forming a second base region and a second emitter/collector region on a second side of the first thin semiconductor wafer opposite the first side;

producing a second thin semiconductor wafer having a third base region and a third collector/emitter region on a third side of the second thin semiconductor wafer; and bonding the first thin semiconductor wafer to the second thin semiconductor wafer.

2. The method of claim 1, wherein producing the second thin semiconductor wafer further includes:

forming the third base region and the third emitter/collector region on the third side of a second thick semiconductor wafer, removing a portion of the second thick semiconductor wafer to produce the second thin semiconductor wafer, and forming a fourth base region and a fourth emitter/collector region on a fourth side of the second thin semiconductor wafer opposite the third side.

3. The method of claim 2, wherein bonding the first thin semiconductor wafer to the second thin semiconductor wafer further includes:

electrically coupling a metal pad of the second base region to a metal pad of the fourth base region, and electrically coupling a metal pad of the second emitter/collector region to a metal pad of the fourth emitter/collector region.

4. The method of claim 1, wherein removing the portion of the first thick semiconductor wafer further includes grinding the second side of the first thick semiconductor wafer.

5. The method of claim 1, wherein forming the first base region and the first emitter/collector region on the first side of the first thick semiconductor wafer further includes activating, with a diffusion process, a first-conductivity-type dopant and a second conductivity-type dopant introduced into different regions on the first side of the first thick semiconductor wafer, and wherein forming the second base region and the second emitter/collector region on the second side of the first thin semiconductor wafer further includes activating, without the diffusion process, the first-conductivity-type dopant and the second conductivity-type dopant introduced into different regions on the second side of the first thin semiconductor wafer.

6. The method of claim 5, wherein activating, without the diffusion process, the first-conductivity-type dopant and the second conductivity-type dopant introduced into the different regions on the second side of the first thin semiconductor wafer further includes activating, with a laser anneal process or a hot plasma process, the first-conductivity-type dopant and the second conductivity-type dopant introduced into the different regions on the second side of the first thin semiconductor wafer.

7. The method of claim 1, wherein a thickness of the first thick semiconductor wafer is at least 750 micrometers, and wherein a thickness of the first thin semiconductor wafer is in a range of about 80 micrometers to about 110 micrometers.

8. A method for fabricating a thin bidirectional bipolar junction transistor device, comprising:

activating, with a diffusion process, a first-conductivity-type dopant and a second conductivity-type dopant introduced into different regions on a first side of a first semiconductor wafer;

reducing a thickness of the first semiconductor wafer by removing a portion of the first semiconductor wafer from a second side of the first semiconductor wafer opposite the first side of the first semiconductor wafer;

activating, without the diffusion process, the first-conductivity-type dopant and the second conductivity-type dopant introduced into different regions on the second side of the first semiconductor wafer;

activating, with the diffusion process, the first-conductivity-type dopant and the second conductivity-type dopant introduced into different regions on a first side of a second semiconductor wafer;

reducing a thickness of the second semiconductor wafer by removing a portion of the second semiconductor wafer from a second side of the second semiconductor wafer opposite the first side of the second semiconductor wafer;

activating, without the diffusion process, the first-conductivity-type dopant and the second conductivity-type dopant introduced into different regions on the second side of the second semiconductor wafer; and bonding the first semiconductor wafer to the second semiconductor wafer.

9. The method of claim 8, wherein activating, without the diffusion process, the first-conductivity-type dopant and the second conductivity-type dopant introduced into the different regions on the second side of the first semiconductor wafer further includes activating, with a laser anneal process or a hot plasma process, the first-conductivity-type dopant and the second conductivity-type dopant introduced into the different regions on the second side of the first semiconductor wafer.

10. The method of claim 8, wherein the diffusion process further includes a furnace process.

11. The method of claim 8, wherein removing the portion of the first semiconductor wafer further includes grinding the second side of the first semiconductor wafer.

12. The method of claim 8, wherein bonding the first semiconductor wafer to the second semiconductor wafer further includes coupling the second side of the first semiconductor wafer to the second side of the second semiconductor wafer.

13. The method of claim 8, wherein the thickness of the first semiconductor wafer is about 750 micrometers before removing the portion of the first semiconductor wafer, and wherein the thickness of the first semiconductor wafer is in a range of about 80 micrometers to about 110 micrometers after removing the portion of the first semiconductor wafer.

14. A thin bidirectional bipolar junction transistor device, comprising:

a first semiconductor wafer including:

a first front side junction including a first base region and a first emitter/collector region on a first side of the first semiconductor wafer, and a first backside junction including a second base region and a second emitter/collector region on a second side of the first semiconductor wafer opposite the first side of the first semiconductor wafer, wherein the first backside junction is thinner than the first front side junction; and a second semiconductor wafer including:

a second front side junction including a third base region and a third emitter/collector region on a first side of the second semiconductor wafer, and a second backside junction including a fourth base region and a fourth emitter/collector region on a second side of the second semiconductor wafer opposite the first side of the second semiconductor wafer, wherein the second backside junction is thinner than the second front side junction, wherein the second side on the first semiconductor wafer is bonded to the second side of the second semiconductor wafer.

15. The thin bidirectional bipolar junction transistor device of claim 14, wherein a metal pad of the second base region is electrically coupled to a metal pad of the fourth base region, and wherein a metal pad of the second emitter/collector region is electrically coupled to a metal pad of the fourth emitter/collector region.

16. The thin bidirectional bipolar junction transistor device of claim 14, wherein each of the first semiconductor wafer and the second semiconductor wafer has a thickness in a range of about 80 micrometers to about 110 micrometers.

17. The thin bidirectional bipolar junction transistor device of claim 14, wherein each of the first semiconductor wafer and the second semiconductor wafer has a diameter of at least 8 inches.

18. The thin bidirectional bipolar junction transistor device of claim 14, wherein a combined thickness of the first semiconductor wafer and the second semiconductor wafer is in a range of about 160 micrometers to about 220 micrometers.

19. The thin bidirectional bipolar junction transistor device of claim 14, wherein each of the first semiconductor wafer and the second semiconductor wafer further includes silicon carbide.

20. The thin bidirectional bipolar junction transistor device of claim 14, wherein each of the first semiconductor wafer and the second semiconductor wafer further includes gallium nitride.

* * * * *